(12) United States Patent
Sohn et al.

(10) Patent No.: US 6,251,780 B1
(45) Date of Patent: Jun. 26, 2001

(54) METHOD FOR FABRICATING THIN FILM AT HIGH TEMPERATURE

(75) Inventors: Dong Kyun Sohn; Ji Soo Park; Jong Uk Bae, all of Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/524,394

(22) Filed: Mar. 13, 2000

(30) Foreign Application Priority Data

Jun. 16, 1999 (KR) .................................................. 99-22578

(51) Int. Cl.[7] .................................................. H01L 21/44
(52) U.S. Cl. .......................... 438/683; 438/682; 438/685
(58) Field of Search .................................... 438/682, 683, 438/685

(56) References Cited

PUBLICATIONS

Derwent–ACC–No: 1985–047514, 06/83.*

* cited by examiner

*Primary Examiner*—Long Pham
(74) *Attorney, Agent, or Firm*—Morgan, Lewis & Bockius LLP

(57) ABSTRACT

A method for fabricating a semiconductor device includes the steps of forming a refractory metal film on a semiconductor substrate, forming a capping film on the refractory metal film, injecting IV group atoms into the capping film to knock atoms of the capping film into the refractory metal film, and forming a metal silicide film at an interface between the semiconductor substrate and the refractory metal film.

22 Claims, 6 Drawing Sheets

METHOD FOR FABRICATING THIN FILM AT HIGH TEMPERATURE

This application claims the benefit of Korean Application No. 22578/1999 filed on Jun. 16, 1999, which is hereby incorporated by reference.

BACKGROUND OF THE INVENTION

1. Field of the Invention

The present invention relates to a method for fabricating a semiconductor device, and more particularly, to a method for fabricating a semiconductor device, which is suitable to form a thin film that is stable at a high temperature.

2. Discussion of the Related Art

As semiconductor devices become smaller from 0.25 micron class to 0.18 and 0.13 micron classes, their sheet resistivity increases and becomes a problem. In order to solve this problem, presently cobalt silicide is widely used which shows a lower resistance than titanium silicide in a micron pattern.

A related art method for fabricating a semiconductor device will be explained with reference to the attached drawings. FIGS. 1A–1D illustrate steps of a related art method for fabricating a semiconductor device.

Referring to FIG. 1A, a field oxide film 12 is formed on a field region of a semiconductor substrate 11 having the field region and an active region defined thereon. A gate insulating film 13 and a gate electrode polysilicon film (not shown) are formed in succession on an entire surface of the semiconductor substrate 11, and subjected to photolithography and etching, to remove the polysilicon film and the gate insulating film 13 selectively and form a gate electrode 14. The gate electrode 14 is used as a mask in implanting impurity ions in the entire surface of the semiconductor substrate 11 lightly, to form LDD (Lightly Doped Drain) regions 15 in the surface of the semiconductor substrate 11 on both sides of the gate electrode 14.

As shown in FIG. 1B, an insulating film is formed on an entire surface of the semiconductor substrate 11 inclusive of the gate electrode 14. The insulating film is then etched back to form insulating sidewalls 16 at both sides of the gate electrode 14. Then, the gate electrode 14 and the insulating film sidewalls 16 are used as masks in implanting source/drain impurity ions ($As^+$ or $P^+$) in an entire surface of the semiconductor substrate 11 heavily, to form source/drain impurity regions 17 in the surface of the semiconductor substrate 11 on both sides of the gate electrode 14 connected to the LDD regions 15.

As shown in FIG. 1C, a cobalt film 18 and a titanium nitride film TiN 19 are formed on an entire surface of the semiconductor substrate 11 in succession, and, as shown in FIG. 1D, subjected to annealing at approximately 500° C., to cause reaction between the cobalt film 18, the gate electrode 14 and the semiconductor substrate 11, thus forming a cobalt silicide film 20. In this instance, the titanium nitride 19 is provided for blocking an influence from oxygen when the cobalt reacts with the silicon by annealing. The titanium nitride film 19 is in general formed in-situ without vacuum break after the formation of the cobalt film 18. The titanium nitride film 19 and the remaining cobalt film 18, which both had no reaction with the semiconductor substrate 11 and the gate electrode 14, are wet etched and removed using a mixed solution of $H_2SO_4:H_2O_2$ or $NH_4OH:H_2O_2$ and a mixed solution of $HCL:H_2O_2:H_2O$, and subjected to annealing at approximately 700–800° C., to lower a resistance of the cobalt silicide film 20. The annealings are conducted at a low temperature for the first time and at a high temperature for the second time in formation of the cobalt silicide film 20 to form a cobalt silicide film 20 with a low resistance because the high temperature annealing forms the cobalt silicide film even at sides of the insulating film sidewalls 16.

However, the related art method for fabricating a semiconductor device has the following problems.

First, the formation of the cobalt silicide film by annealing consumes the substrate excessively, and partial excessive formation of the cobalt silicide film causes an excessive flow of leakage current at a shallow junction that is inevitable when devices are scaled down.

Second, the titanium nitride film only blocks an influence from oxygen, but can not prevent the consumption of the substrate caused by cobalt.

Third, a thin film of cobalt silicide, formed by forming a cobalt film on a polysilicon film of fine grain size and subjecting to annealing, is unstable and susceptible to heat because cobalt atoms can migrate to a lower portion of the polysilicon film along grain boundaries of the polysilicon film.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device, which can form a thin film that is stable at a high temperature.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of (1) forming a refractory metal film on a semiconductor substrate, (2) forming a capping film on the refractory metal film, (3) injecting IV group atoms into the capping film, to knock on atoms of the capping film into the refractory metal film, and (4) forming a metal silicide film at an interface between the semiconductor substrate and the refractory metal film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. FIGS. 2A~2D illustrate steps of a method for fabricating a semiconductor device in accordance with a preferred embodiment of the present invention.

Figure 1A:
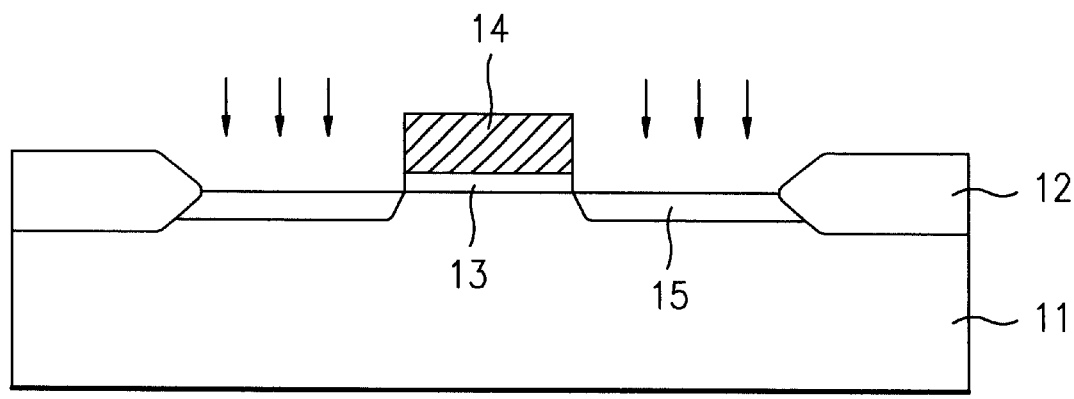
FIGS. 1A–1D illustrate steps of a related art method for fabricating a semiconductor device.
Figure 1B:
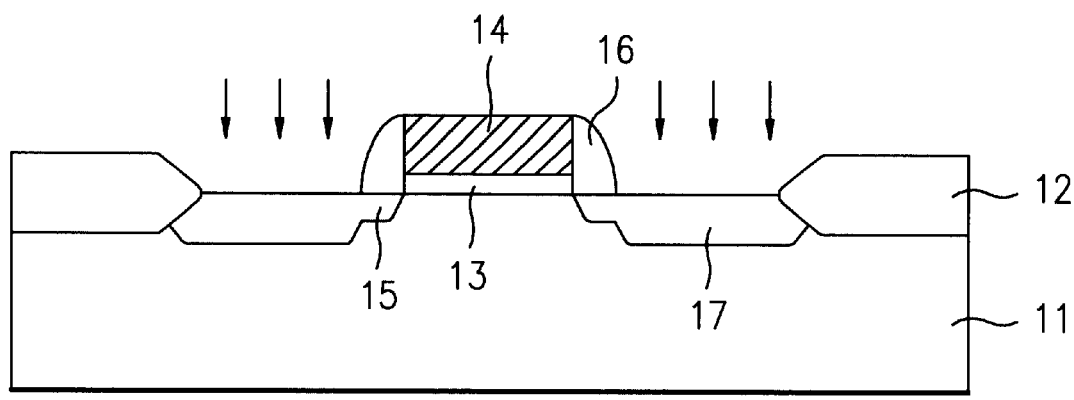
Figure 1C:
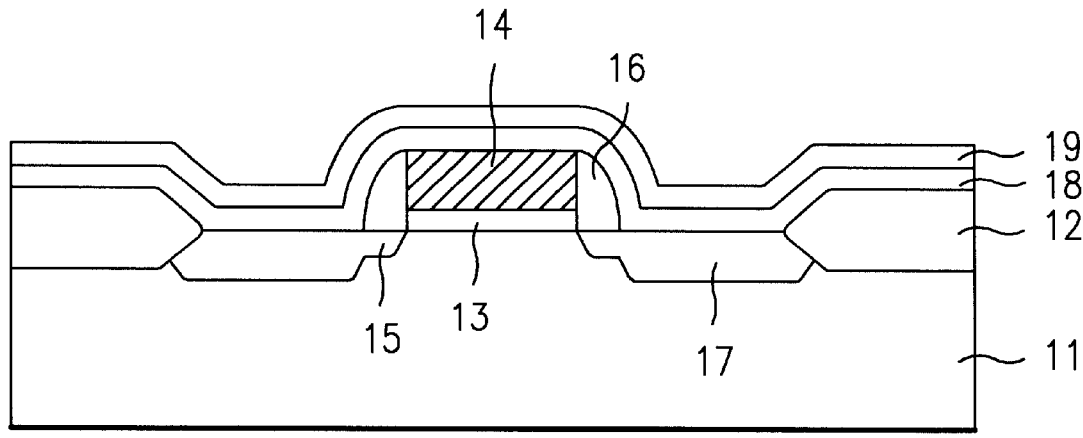
Figure 1D:
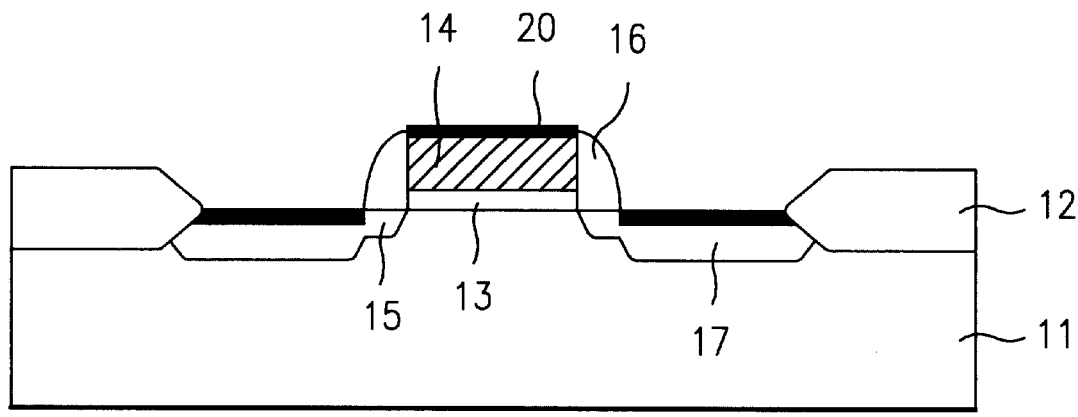
Figure 2A:
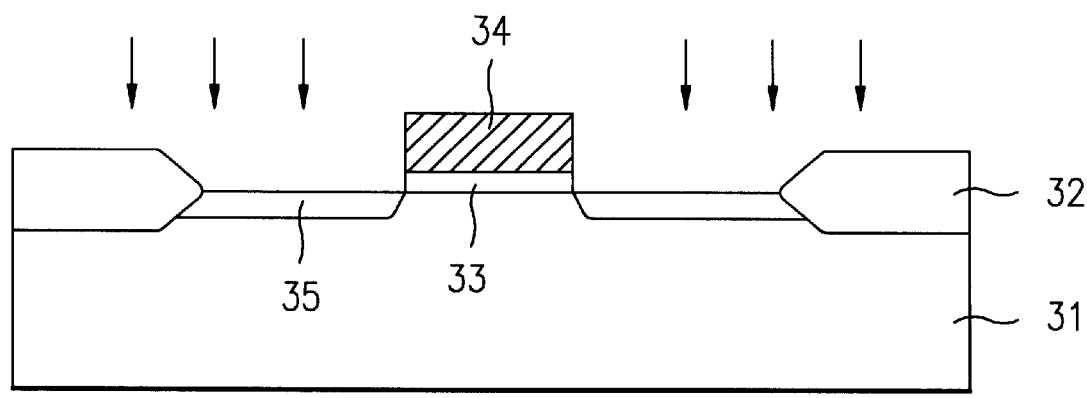
FIGS. 2A–2D illustrate steps of a method for fabricating a semiconductor device in accordance with a preferred embodiment of the present invention.

Referring to FIG. 2A, a field oxide film 32 is formed on a field region of a semiconductor substrate 31 having the field region and an active region defined thereon. A gate insulating film 33 and a gate electrode polysilicon film (not shown) are formed on an entire surface of the semiconductor substrate 31 in succession, and subjected to photolithography and etching, to remove the polysilicon film and the gate insulating film 33 selectively and to form a gate electrode 34. The gate electrode 34 is used as a mask in implanting impurity ions in an entire surface of the semiconductor substrate 31 lightly, to form LDD (Lightly Doped Drain) regions 35 in the surface of the semiconductor substrate 31 on both sides of the gate electrode 34.

Figure 2B:
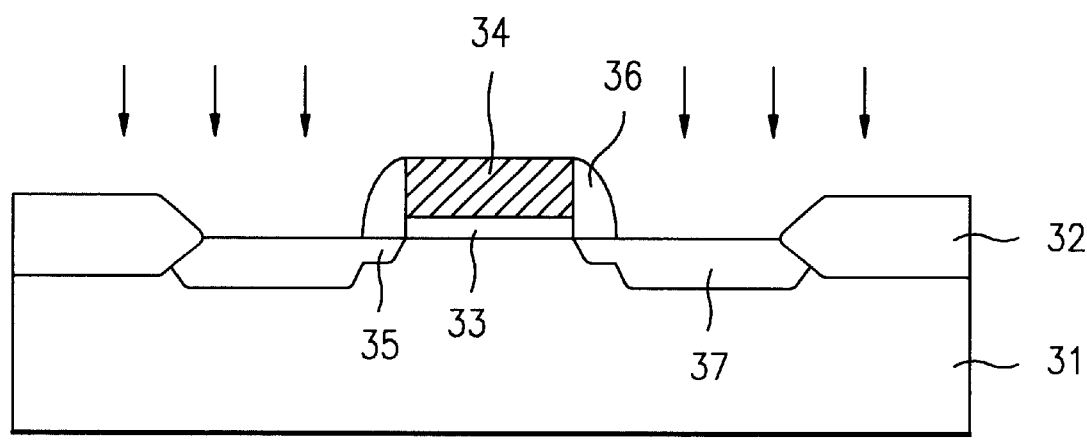

As shown in FIG. 2B, an insulating film (such as a CVD oxide film or nitride film) is formed on the entire surface of the semiconductor substrate 31 inclusive of the gate electrode 34, and then etched back to form insulating sidewalls 36 at both sides of the gate electrode 34. Then, the gate electrode 34 and the insulating film sidewalls 36 are used as masks in implanting source/drain impurity ions (As+ or P+) in the entire surface of the semiconductor substrate 31 heavily, to form source/drain impurity regions 37 in the surface of the semiconductor substrate 31 on both sides of the gate electrode 34 connected to the LDD regions 35.

Figure 2C:
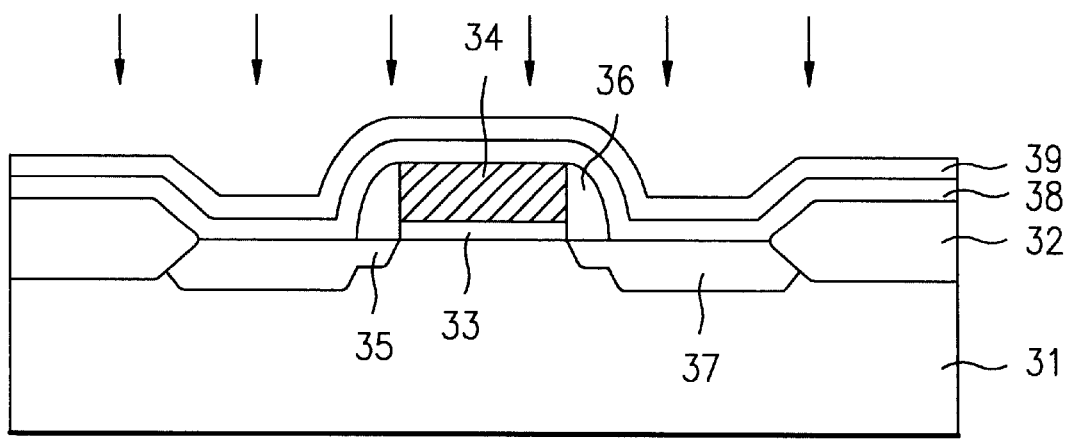

As shown in FIG. 2C, a cobalt film 38 and a titanium nitride film 39 are formed on an entire surface of the semiconductor substrate 31 in succession. The cobalt film 38 is formed to a thickness of 20~500 Å, and the titanium nitride film 39 is formed to a thickness of 20~500 Å. Then, ions of IV group, such as silicon or germanium, are implanted in the titanium nitride film 39 at approximately 1 keV~300 keV and 1E13~1E16/cm² conditions. Instead of the film of cobalt, a film of Ti, W, Ta, Mo, Cr, Ni, Zr, Hf, Pd or Pt may be used. Instead of the titanium nitride film 39, a film of Ti, W, Ta, Mo, Cr, Ni, Zr, Hf, Pd or Pt may be used. Instead of Si and Ge ions, ions of Ar, As, P, Sb or N may be used. In this instance, the implanted silicon or germanium knock on the titanium atoms in the titanium nitride film 39 so that the titanium atoms move into the cobalt film 38.

Figure 2D:
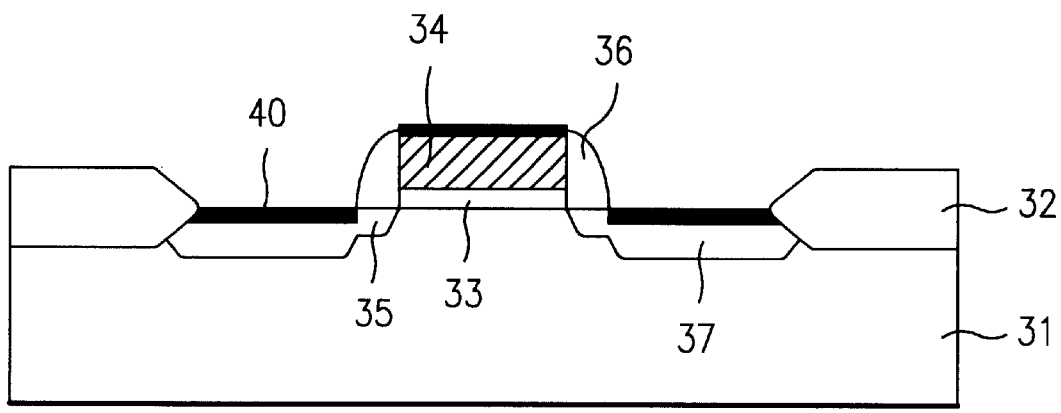

As shown in FIG. 2D, an annealing is conducted at approximately 500° C., to cause reaction between the cobalt film 38, the gate electrode 34 and the semiconductor substrate 31, thus forming a cobalt silicide film 40. In this instance, the titanium nitride 39 is provided for blocking an influence from oxygen when the cobalt reacts with the silicon by annealing. The titanium nitride film 39 is general formed in-situ without vacuum break after the formation of the cobalt film 38. The titanium nitride film 39 and the remaining cobalt film 38, which both had no reaction with the semiconductor substrate 31 and the gate electrode 34, are then wet etched and removed using a mixed solution of $H_2SO_4{:}H_2O_2$ or $NH_4OH{:}H_2O_2$ and a mixed solution of $HCl{:}H_2O_2{:}H_2O$, and subjected to annealing at approximately 700~800° C., to lower a resistance of the cobalt silicide film 20. The reason that an annealing is conducted at approximately 500° C. to cause the cobalt film to react with the semiconductor substrate 31 and the gate electrode 34 for the first time and another annealing is conducted at approximately 700~800° C. for the second time in the formation of the cobalt silicide film 40 is that, if the annealing is conducted at a high temperature from the start, the cobalt silicide film 40 will be formed even at unwanted portions of the insulating film sidewalls 36.

Figure 3:
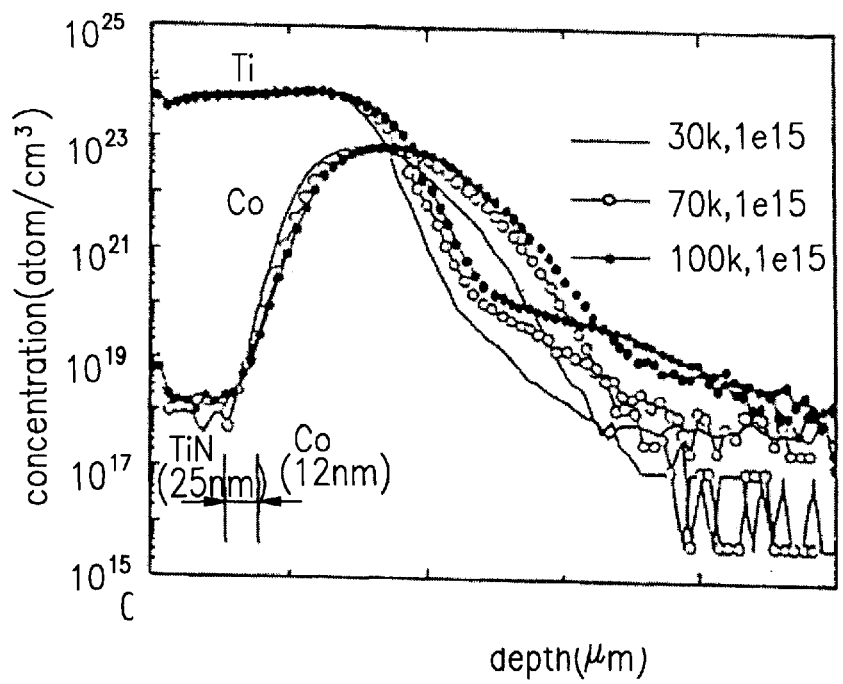
FIG. 3 illustrates profiles of Ti and Co distributions vs. energy measured by SIMS.

FIG. 3 illustrates profiles of Ti and Co distributions vs. energies measured by SIMS for TiN and cobalt layers deposited to thicknesses of 25 nm and 12 nm respectively and ion implanted with a fixed dose of $1E15/cm^2$. That is, referring to FIG. 3, as an ion injection energy increased from 30 keV to 100 keV, Ti is distributed deeper into the cobalt film and the substrate because of the knock on effect in which injected IV group ions such as silicon or germanium knock on Ti atoms in the TiN capping film.

Figure 4:
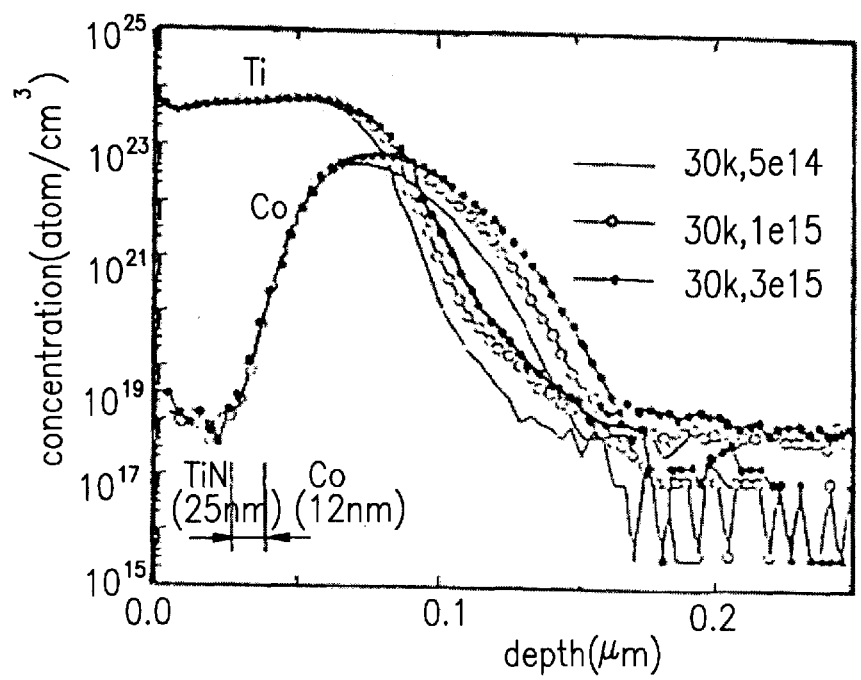
FIG. 4 illustrates profiles of Ti and Co distributions vs. doses measured by SIMS.

FIG. 4 illustrates profiles of Ti and Co distributions vs. doses measured by SIMS for TiN and cobalt layers deposited to thicknesses of 25 nm and 12 nm respectively and Si ion implanted with a fixed ion injection energy of 30 keV. That is, referring to FIG. 4, it can be known that as a dose is increased, Ti is distrubuted deeper. Therefore, it can also be known that an increased dose enhances the Ti knock on effect.

Figure 5:
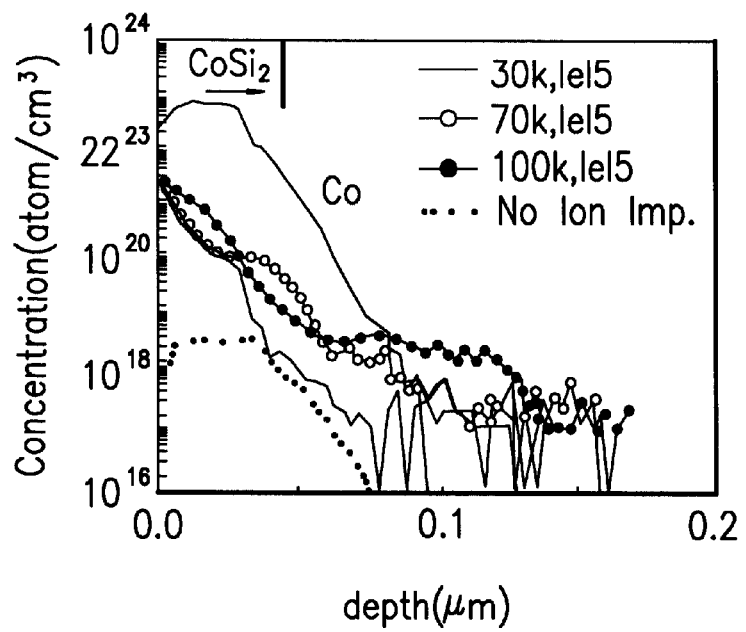
FIG. 5 illustrates SIMS profiles of Ti atoms distributed in a CoSix film shown in FIG. 3.

FIG. 5 illustrates SIMS profiles of Ti atoms distributed in a CoSix film shown in FIG. 3 formed by subjecting the samples analyzed in FIG. 3 to a first time annealing to make silicide reaction, removing the TiN capping layer using a mixed solution of $H_2SO_4{:}H_2O_2$ or $NH_4OH{:}H_2O_2$ and a mixed solution of $HCl{:}H_2O_2{:}H_2O$, for cases when both no ions are implanted and ions are implanted while varying ion implanting energy. As shown in FIG. 5, an amount of Ti atoms distributed in the cobalt silicide film is increased by more than two times when Si ions are implanted, which trend becomes more significant as the energy is increased.

Figure 6:
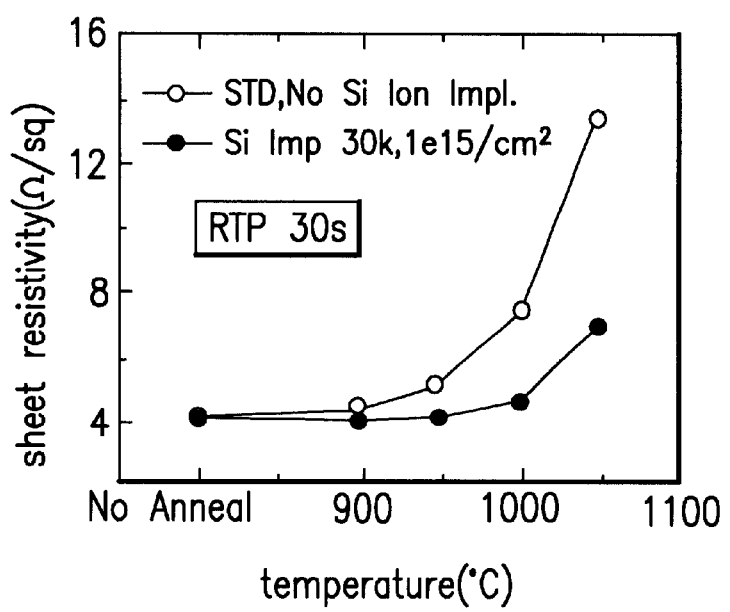
FIG. 6 illustrates profiles showing results of measurement of electric sheet reisistivities vs. conditions of a following heat treatment for a cobalt silicide film of the present invention.

FIG. 6 illustrates profiles showing results of measurements of electric sheet reisistivities vs. conditions of a following heat treatment for a cobalt silicide film of the present invention for cases when both no Si ions are implanted and Si ions are implanted at 30 keV and 1E15 $cm^2$. As shown in FIG. 6, it can be known that a cobalt silicide film of the present invention shows a secure thermal stability in which a degradation trend is reduced when Si is implanted. In other words, when Si is not implanted, an electric resistance increases much more as an annealing temperature is increased compared to a first time annealing.

As has been explained, the method for fabricating a semiconductor device according to the present invention can improve a thermal stability by ion injecting Si or Ge ions on a TiN film, to knock Ti atoms into a cobalt film. That is, it is known that the degradation after annealing of a metal thin film is caused by agglomeration coming from grain growth of the metal thin film in annealing. Eventually, the Ti atoms knocked into the thin film and stuffed in grain boundaries impede grain boundary growth, which makes the agglomeration poor even at an elevated temperature. Particularly, the Ti knocked into the cobalt silicide film can prevent degradation in formation of a cobalt silicide film on a polysilicon film.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

forming a refractory metal film on a semiconductor substrate;

forming a capping film on the refractory metal film;

injecting IV group atoms into the capping film, to knock atoms of the capping film into the refractory metal film; and forming a metal silicide film at an interface between the semiconductor substrate and the refractory metal film.

2. The method as claimed in claim 1, wherein the refractory metal film is one selected from Co, Ti, W, Ta, Mo, Cr, Ni, Zr, Hf, Pd and Pt.

3. The method as claimed in claim 1, wherein the capping film is one selected from TiN, Ti, W, Ta, Mo, Cr, Ni, Zr, Hf, Pd and Pt.

4. The method as claimed in claim 1, wherein the IV group atoms are selected from Si, Ge, Ar, As, P, Sb and N.

5. The method as claimed in claim 1, wherein the IV group atoms are injected at approximately 1 keV~300 keV, and 1E13~1E16/cm$^2$.

6. The method as claimed in claim 1, wherein the refractory metal film is formed to a thickness of approximately 20~500 Å.

7. The method as claimed in claim 1, wherein the capping film is formed to a thickness of approximately 20~500 Å.

8. The method as claimed in claim 1, wherein the capping film is formed in succession to formation of the refractory metal film without a vacuum break.

9. The method as claimed in claim 1, wherein the metal silicide film is formed by subjecting the semiconductor substrate and the refractory metal film to annealing at a temperature of approximately 500~800° C., to cause reaction between the semiconductor substrate and the refractory metal film.

10. A method for fabricating a semiconductor device, comprising the steps of:

forming a gate electrode over a semiconductor substrate with a gate insulating film therebetween;

forming insulating film sidewalls at both sides of the gate electrode;

forming source/drain impurity regions in a surface of the semiconductor device on both sides of the gate electrode;

forming a refractory metal film and a capping film in succession on the surface of the semiconductor substrate including the gate electrode;

injecting IV group atoms into the capping film, to knock atoms of the capping film into the refractory metal film;

conducting a first annealing to cause reaction between the refractory metal film, the gate electrode and the semiconductor substrate respectively, thereby forming a metal silicide film;

selectively removing the capping film and the refractory metal film remaining after the reaction; and conducting a second annealing to reduce a resistance of the metal silicide film.

11. The method as claimed in claim 10, wherein the refractory metal film is one selected from Co, Ti, W, Ta, Mo, Cr, Ni, Zr, Hf, Pd and Pt.

12. The method as claimed in claim 10, wherein the capping film is one selected from TiN, Ti, W, Ta, Mo, Cr, Ni, Zr, Hf, Pd and Pt.

13. The method as claimed in claim 10, wherein the IV group atoms are selected from Si, Ge, Ar, As, P, Sb and N.

14. The method as claimed in claim 10, wherein the IV group atoms are injected at approximately 1 keV~300 keV, and 1E13~1E16/cm$^2$.

15. The method as claimed in claim 10, wherein the first annealing is conducted at a temperature lower than the second annealing.

16. The method as claimed in claim 10, wherein the first annealing is conducted at a temperature no higher than approximately 500° C.

17. The method as claimed in claim 10, wherein the second annealing is conducted at approximately 700~800° C.

18. The method as claimed in claim 10, wherein the refractory metal film is formed to a thickness of approximately 20~500 Å.

19. The method as claimed in claim 10, wherein the capping film if formed to a thickness of approximately 20~500 Å.

20. The method as claimed in claim 10, wherein the step of selectively removing the capping film and the refractory metal film remaining after the reaction is carried out by wet etching.

21. The method as claimed in claim 20, wherein the wet etching is conducted using a mixed solution of $H_2SO_4:H_2O_2$ or $NH_4OH:H_2O_2$ and a mixed solution of $HCl:H2O2:H2O$.

22. The method as claimed in claim 10, wherein the capping film is formed in succession to formation of the refractory metal film without a vacuum break.

* * * * *